(12) United States Patent
Hibino

(10) Patent No.: US 9,451,711 B2
(45) Date of Patent: Sep. 20, 2016

(54) PRINTED WIRING BOARD AND METHOD FOR MANUFACTURING PRINTED WIRING BOARD

(71) Applicant: IBIDEN CO., LTD., Ogaki (JP)

(72) Inventor: Toshiaki Hibino, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 150 days.

(21) Appl. No.: 14/169,314

(22) Filed: Jan. 31, 2014

(65) Prior Publication Data

US 2014/0216794 A1 Aug. 7, 2014

(30) Foreign Application Priority Data

Feb. 6, 2013 (JP) ................................ 2013-021214

(51) Int. Cl.
*H05K 1/03* (2006.01)
*H05K 3/42* (2006.01)
(Continued)

(52) U.S. Cl.
CPC ............ *H05K 3/429* (2013.01); *H05K 3/0032* (2013.01); *H05K 3/4602* (2013.01);
(Continued)

(58) Field of Classification Search
CPC .. H05K 1/0366; H05K 1/0373; H05K 1/115; H05K 3/429; H05K 3/0055; H05K 3/108; H05K 3/0032; H05K 3/4602; H05K 3/427; H05K 3/002; H05K 3/4608; H05K 3/445; H05K 2201/09827; H05K 2201/09863; H05K 2201/0209; H05K 2201/2072; H05K 2201/09854; H05K 2201/09536; H05K 2201/09836; H05K 2201/09509; H05K 2201/096; H05K 2203/1476; H05K 2203/108; H05K 2203/0554; H05K 2203/1184; H05K 2203/0796; H05K 2203/0285; H05K 2203/0292; H05K 2203/0793; H05K 2203/0789; H01L 21/4857; H01L 21/486; H01L 23/49822; H01L 23/49827; H01L 2224/16225; H01L 2924/15311; Y10T 29/49124
USPC .......... 174/255, 266; 427/97.2, 554; 216/18, 216/90, 105, 83; 29/829
See application file for complete search history.

(56) References Cited

U.S. PATENT DOCUMENTS 5,352,325 A * 10/1994 Kato ...................... H05K 3/002
216/105
2003/0092293 A1* 5/2003 Ohtsuki .............. H01R 13/2414
439/66

(Continued)

FOREIGN PATENT DOCUMENTS

JP 2001-168529 A 6/2001
JP 2007-227512 A 9/2007

*Primary Examiner* — Timothy Thompson
*Assistant Examiner* — Guillermo Egoavil
(74) *Attorney, Agent, or Firm* — Oblon, McClelland, Maier & Neustadt, L.L.P.

(57) ABSTRACT

A printed wiring board includes an insulating substrate having a penetrating hole formed through the substrate, a first conductive pattern formed on first surface of the substrate, a second conductive pattern formed on second surface of the substrate on the opposite side of the first surface, and a through-hole conductor formed in the penetrating hole in the substrate such that the conductor is connecting the first conductive pattern on the first surface of the substrate and the second conductive pattern on the second surface of the substrate. The penetrating hole has a first opening portion opening on the first surface of the substrate, a second opening portion opening on the second surface of the substrate and a third opening portion connecting the first and second opening portions, and the third opening portion has the maximum diameter which is greater than the minimum diameters of the first and second opening portions.

23 Claims, 13 Drawing Sheets

(51) Int. Cl.
*H05K 3/00* (2006.01)
*H05K 3/46* (2006.01)
*H05K 3/10* (2006.01)

(52) U.S. Cl.
CPC ......... *H05K 1/0366* (2013.01); *H05K 1/0373* (2013.01); *H05K 3/0055* (2013.01); *H05K 3/108* (2013.01); *H05K 2201/0209* (2013.01); *H05K 2201/09536* (2013.01); *H05K 2201/09827* (2013.01); *H05K 2201/09836* (2013.01); *H05K 2201/09854* (2013.01); *H05K 2201/09863* (2013.01); *H05K 2201/2072* (2013.01); *H05K 2203/108* (2013.01); *H05K 2203/1476* (2013.01)

(56) References Cited

U.S. PATENT DOCUMENTS

2007/0124929 A1* 6/2007 Ohsumi ............... H05K 3/0094
  29/852
2012/0246924 A1* 10/2012 Hibino .............. H01L 23/49827
  29/829

* cited by examiner (A)

(B)

(C)

(A)

(B)

(C)

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2013-021214, filed Feb. 6, 2013, the entire contents of which are incorporated herein by reference.

BACKGROUND OF THE INVENTION

1. Field of the Invention

The present invention relates to a printed wiring board having an insulating substrate that is provided with a through-hole conductor, and a buildup layer that is formed by laminating an interlayer insulation layer and a conductive layer on the insulating substrate, and to a method for manufacturing the printed wiring board.

2. Description of Background Art

In a buildup printed wiring board formed by providing a buildup layer on an insulating substrate, a through-hole conductor is formed to connect the upper and lower sides of the insulating substrate. JP 2001-168529 A and JP 2007-227512 A describes a through-hole conductor formed by filling a hole in an insulating substrate with plating. The entire contents of this publication are incorporated herein by reference.

SUMMARY OF THE INVENTION

According to one aspect of the present invention, a printed wiring board includes an insulating substrate having a penetrating hole formed through the insulating substrate, a first conductive pattern formed on a first surface of the insulating substrate, a second conductive pattern formed on a second surface of the insulating substrate on the opposite side with respect to the first surface of the insulating substrate, and a through-hole conductor formed in the penetrating hole in the insulating substrate such that the through-hole conductor is connecting the first conductive pattern on the first surface of the insulating substrate and the second conductive pattern on the second surface of the insulating substrate. The penetrating hole has a first opening portion opening on the first surface of the insulating substrate, a second opening portion opening on the second surface of the insulating substrate and a third opening portion connecting the first opening portion and the second opening portion, and the third opening portion has the maximum diameter which is greater than the minimum diameter of the first opening portion and the minimum diameter of the second opening portion.

According to another aspect of the present invention, a method for manufacturing a printed wiring board includes forming a penetrating hole through an insulating substrate, forming a first conductive pattern on a first surface of the insulating substrate, forming a second conductive pattern on a second surface of the insulating substrate on the opposite side with respect to the first surface of the insulating substrate, and forming a through-hole conductor including a plating material in the penetrating hole in the insulating substrate such that the through-hole conductor is connecting the first conductive pattern on the first surface of the insulating substrate and the second conductive pattern on the second surface of the insulating substrate. The forming of the penetrating hole includes forming a first opening portion opening on the first surface of the insulating substrate, forming a second opening portion opening on the second surface of the insulating substrate and forming a third opening portion connecting the first opening portion and the second opening portion such that the third opening portion has the maximum diameter which is greater than the minimum diameter of the first opening portion and the minimum diameter of the second opening portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
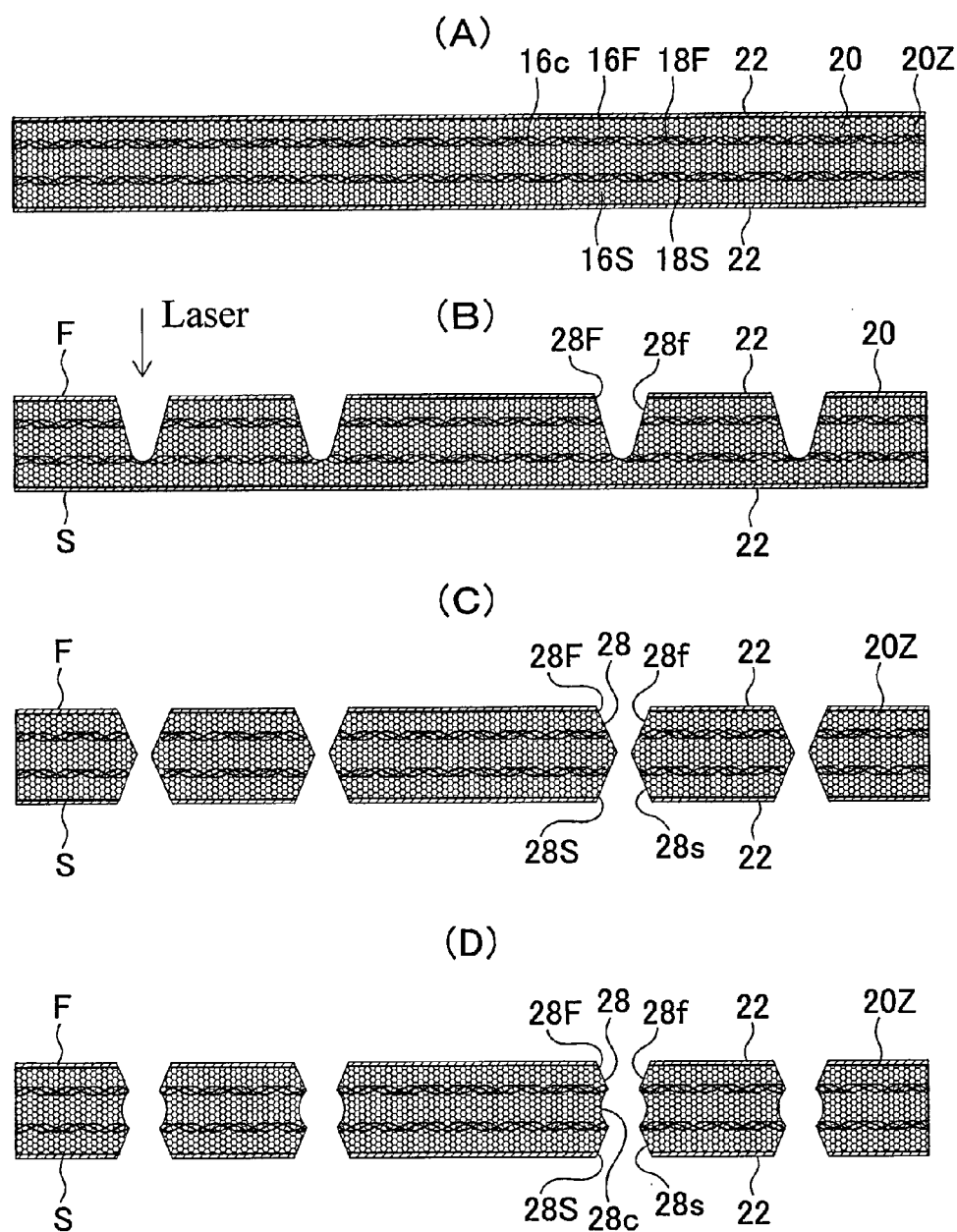
FIGS. 1A to 1D are process drawings illustrating the method for manufacturing a printed wiring board of a first embodiment of the present invention.
Figure 2:
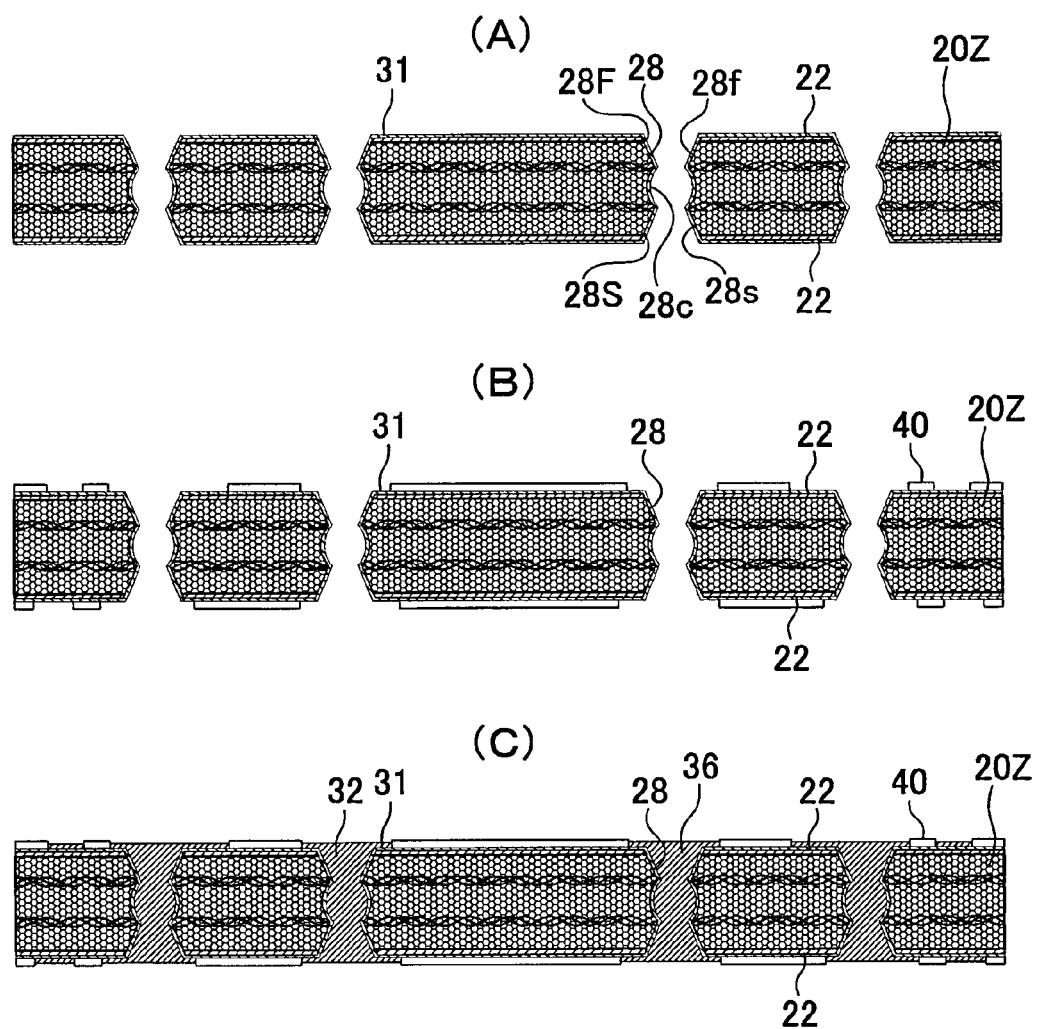
FIGS. 2A to 2C are process drawings illustrating the method for manufacturing the printed wiring board of the first embodiment.
Figure 3:
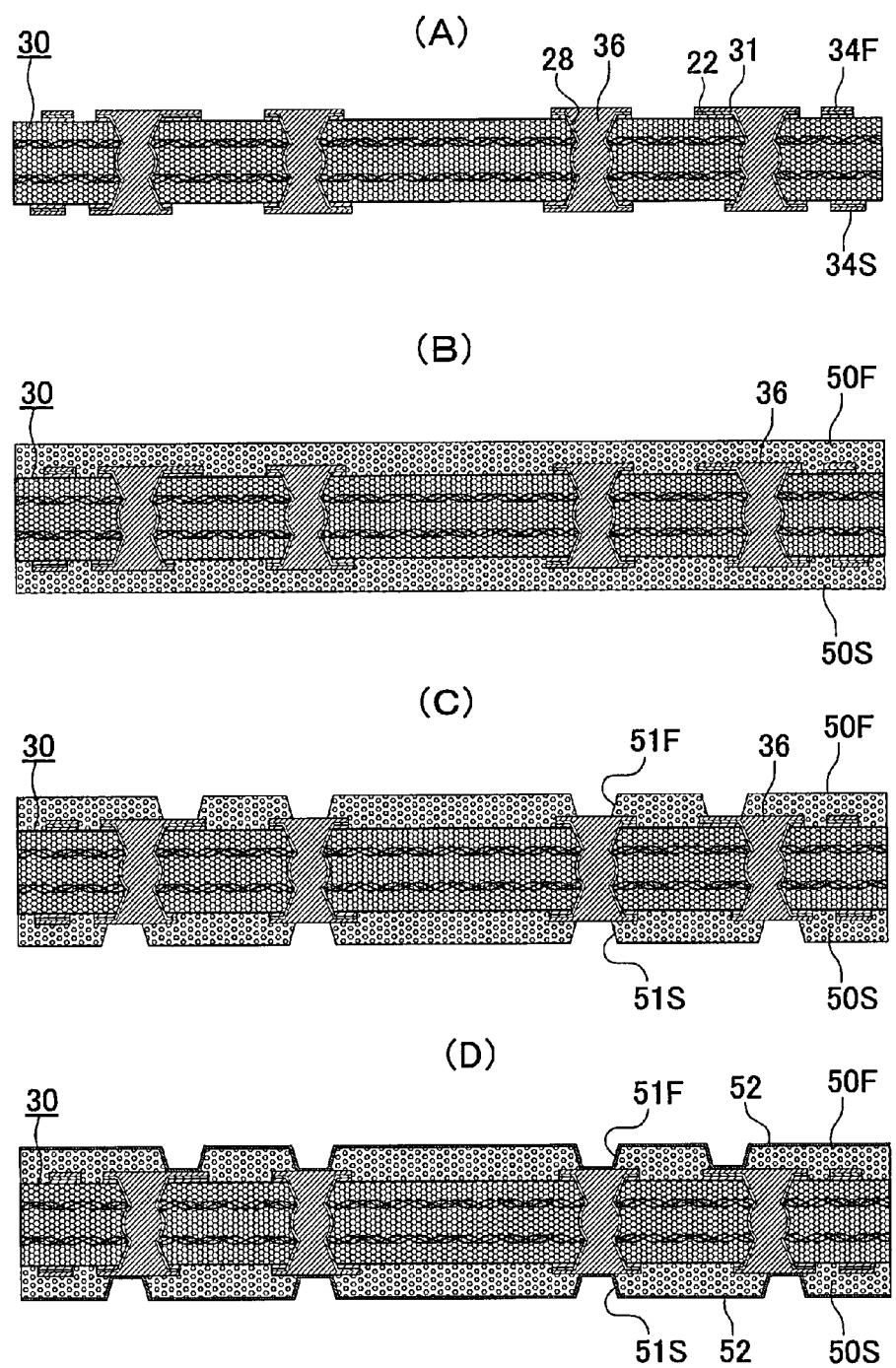
FIGS. 3A to 3D are process drawings illustrating the method for manufacturing the printed wiring board of the first embodiment.
Figure 4:
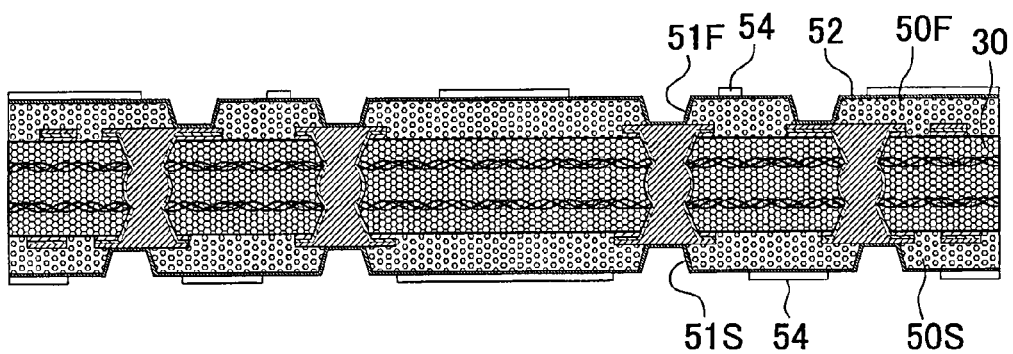
FIGS. 4A to 4C are process drawings illustrating the method for manufacturing the printed wiring board of the first embodiment.
Figure 4:
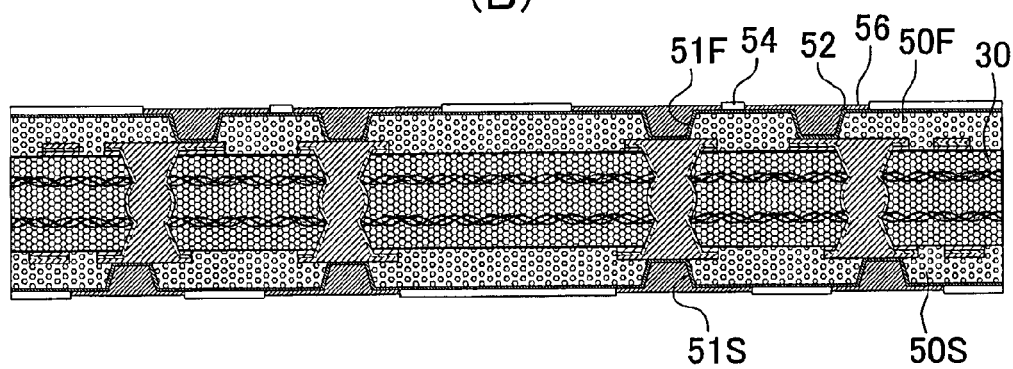
Figure 4:
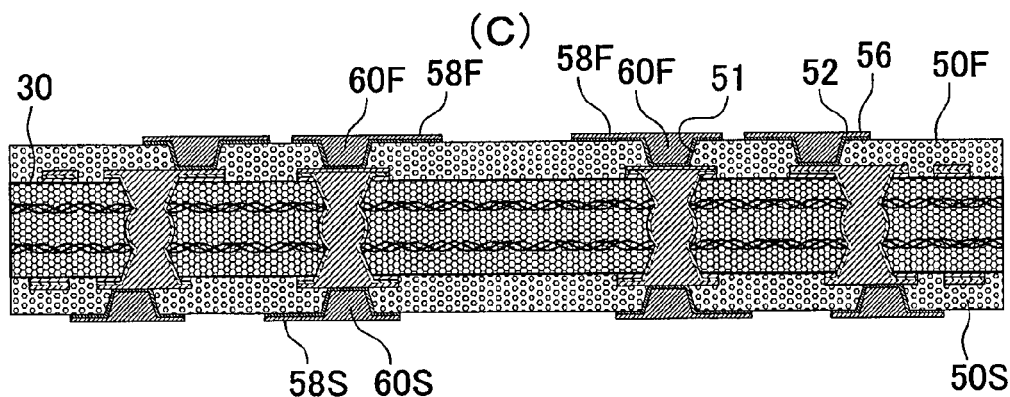
Figure 5:
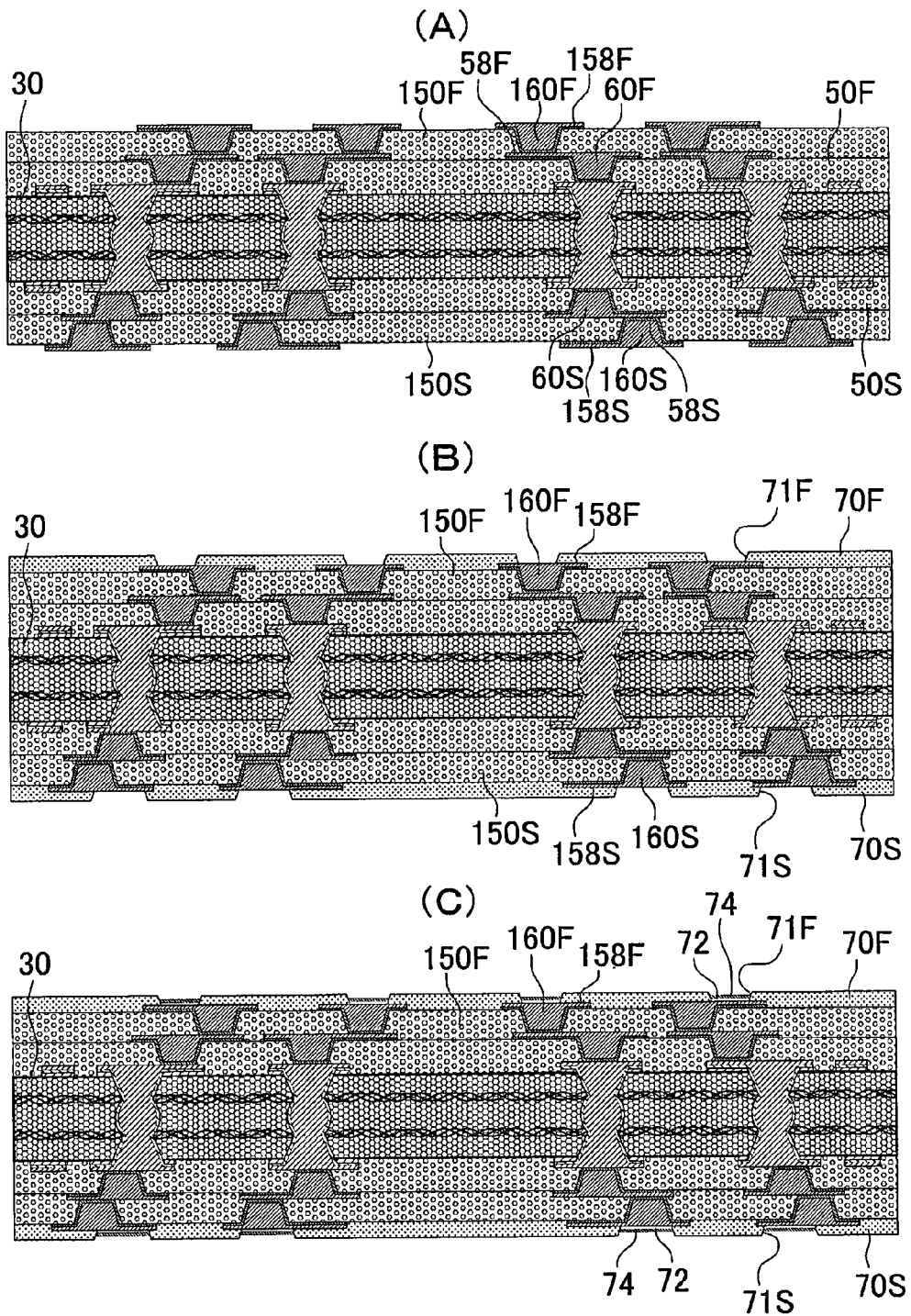
FIGS. 5A to 5C are process drawings illustrating the method for manufacturing the printed wiring board of the first embodiment.

The embodiments will now be described with reference to the accompanying drawings, wherein like reference numerals designate corresponding or identical elements throughout the various drawings.

First Embodiment

A printed wiring board according to a first embodiment of the present invention is described with reference to the cross-sectional views of FIG. 6 and FIG. 7.

Figure 6:
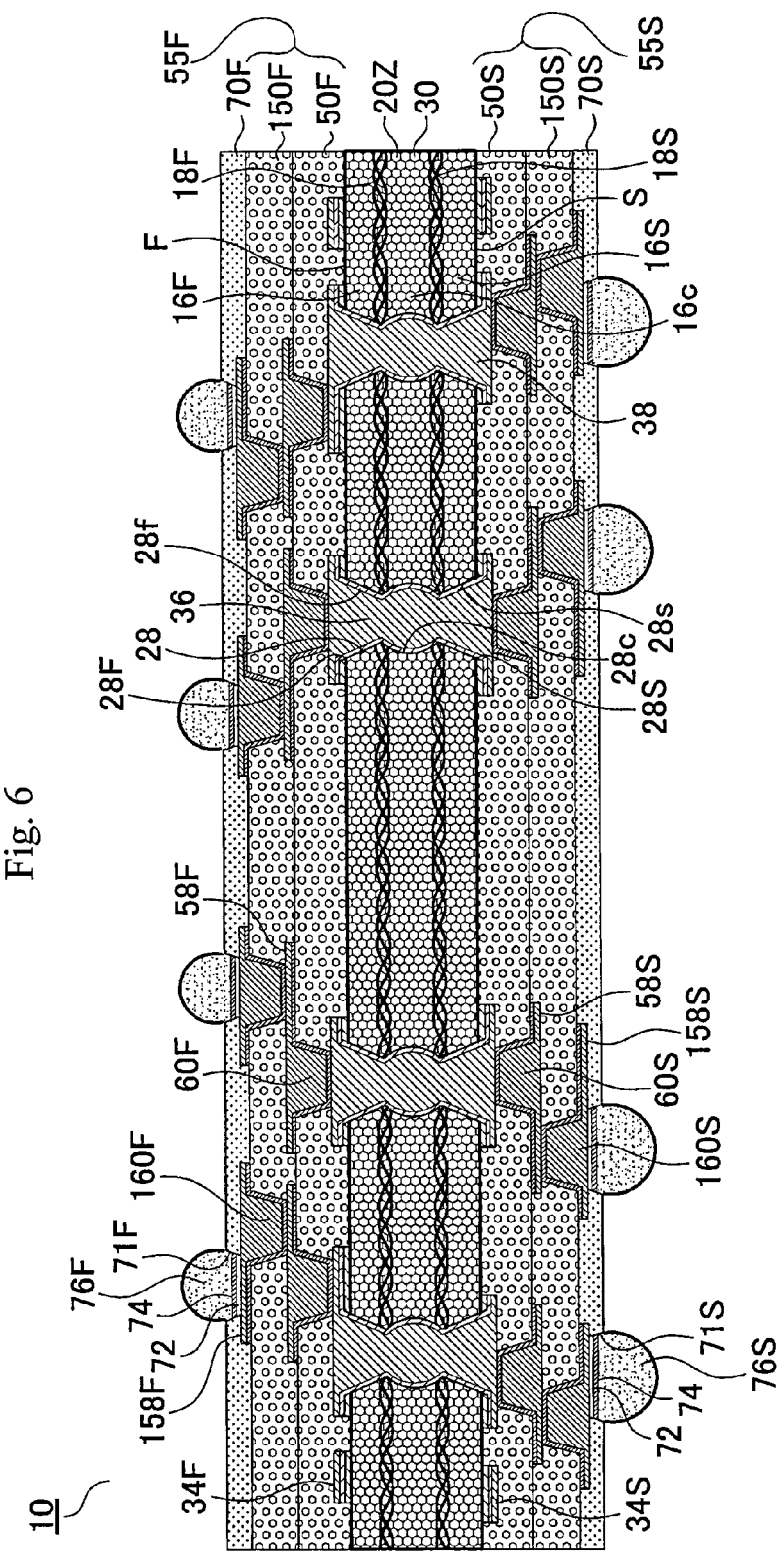
FIG. 6 is a cross-sectional view of the printed wiring board in a state before an IC chip is mounted.

FIG. 6 illustrates the printed wiring board 10 in a state before an IC chip is mounted. The printed wiring board 10 is formed by respectively laminating interlayer insulation layers (50F, 50S, 150F, 150S) and conductive layers (58F, 58S, 158F, 158S) on both sides of an insulating substrate 30.

In the printed wiring board 10 of the first embodiment, a conductive pattern (34F) and a conductive pattern (34S) are formed on the first surface (F) and the second surface (S) of the insulating substrate 30, respectively. The conductive pattern (34F) on the first surface (upper side) (F) and the conductive pattern (34S) on the second surface (S) (lower side) of the insulating substrate 30 are connected to each other by a through-hole conductor 36. The through-hole conductor 36 is formed by being copper-plated in a penetrating hole 28 provided in the insulating substrate 30. The penetrating hole 28 is made up of a first opening portion (28f) having a first opening (28F) on the first surface (upper side) (F), a second opening portion (28s) having a second opening (28S) on the second surface (lower side) (S), and a third opening portion (28c) that is formed by enlarging the connection portion between the first and second opening portions (28f, 28s) using a laser. The first opening portion (28f) is tapered from the first surface toward the second surface, and the second opening portion (28s) is tapered from the second surface toward the first surface; the first and second opening portions (28f, 28s) are connected to each other by the third opening portion (28c) in the insulating substrate 30. The boundary between the third opening portion (28c) and the first opening portion (28f) is where the diameter of the first opening portion (28f) becomes minimum; and the boundary between the third opening portion (28c) and the second opening portion (28s) is where the diameter of the second opening portion (28s) becomes minimum. The maximum diameter of the third opening portion (28c) is greater than the minimum diameter of either of the first and second opening portions (28f, 28s). Here, "diameter" means the diameter of a (circular) cross section of the penetrating hole 28, when it is sliced with a plane that is parallel to the first and second surfaces of the insulating substrate 30.

The through-hole conductor 36 is preferred to be formed by filling penetrating hole 28 with copper plating. Since the through-hole conductor 36 formed by the penetrating hole being filled with copper plating exhibits mechanical strength against stress, connection reliability is thought to be high.

On the first surface (F) of the insulating substrate 30, a buildup layer (55F) is formed with an interlayer insulation layer (50F) having via conductors (60F) and conductive layers (58F), and an interlayer insulation layer (150F) having via conductors (160F) and conductive layers (158F). A solder resist layer (70F) is formed on the buildup layer (55F), and solder bumps (76F) for mounting an IC chip are formed through the opening portions (71F) of the solder resist layer (70F).

On the second surface (S) of the insulating substrate 30, a buildup layer (55S) is formed with an interlayer insulation layer (50S) having via conductors (60S) and conductive layers (58S), and the interlayer insulation layer (150S) having via conductors (160S) and conductive layers (158S). A solder resist layer (70S) is formed on the buildup layer (55S), and BGA solder bumps (76S) for connection with a motherboard are formed through the opening portions (71S) of the solder resist layer (70S).

Figure 7:
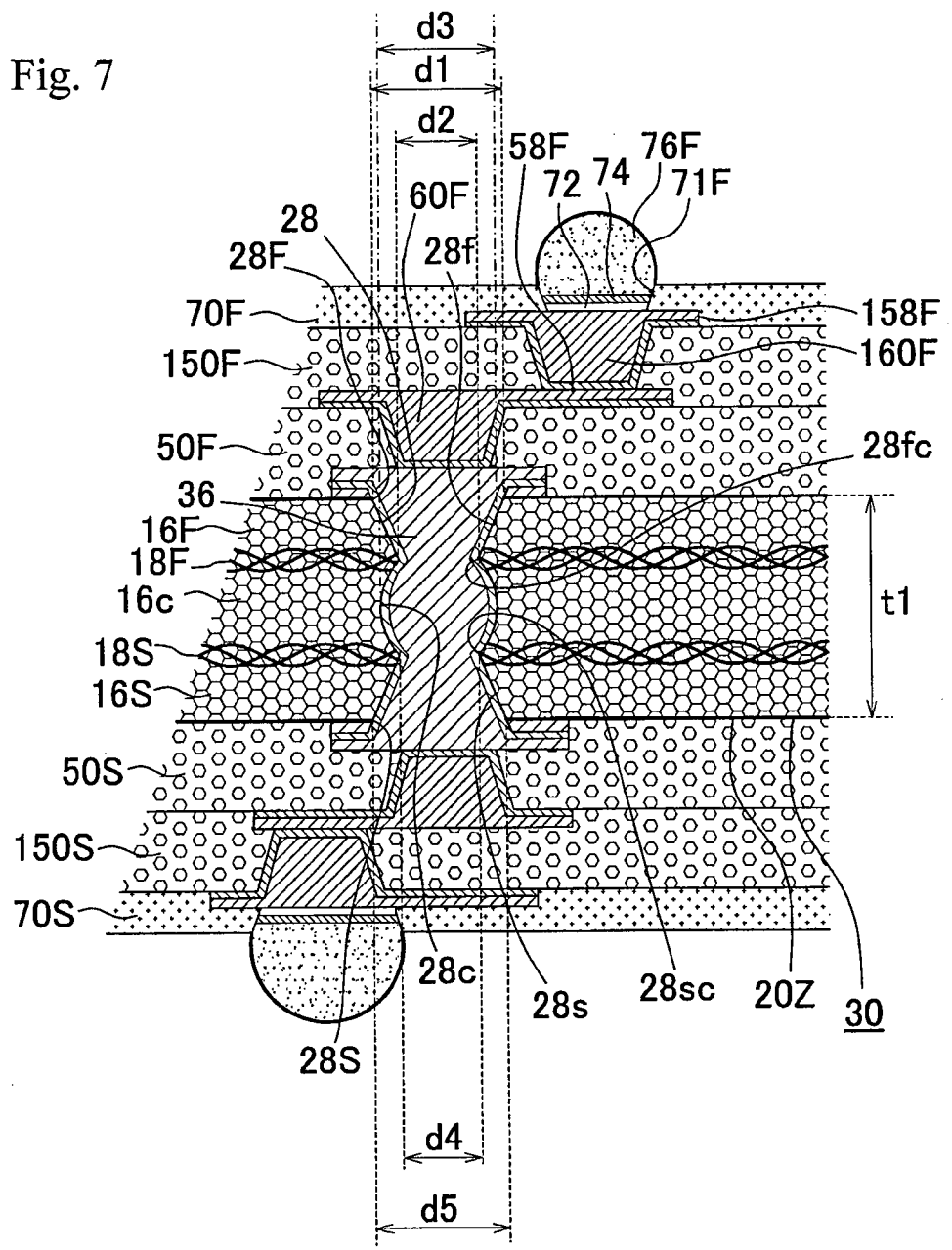
FIG. 7 is a magnified cross-sectional view of a through-hole conductor in the printed wiring board illustrated in FIG. 6.
Figure 8:
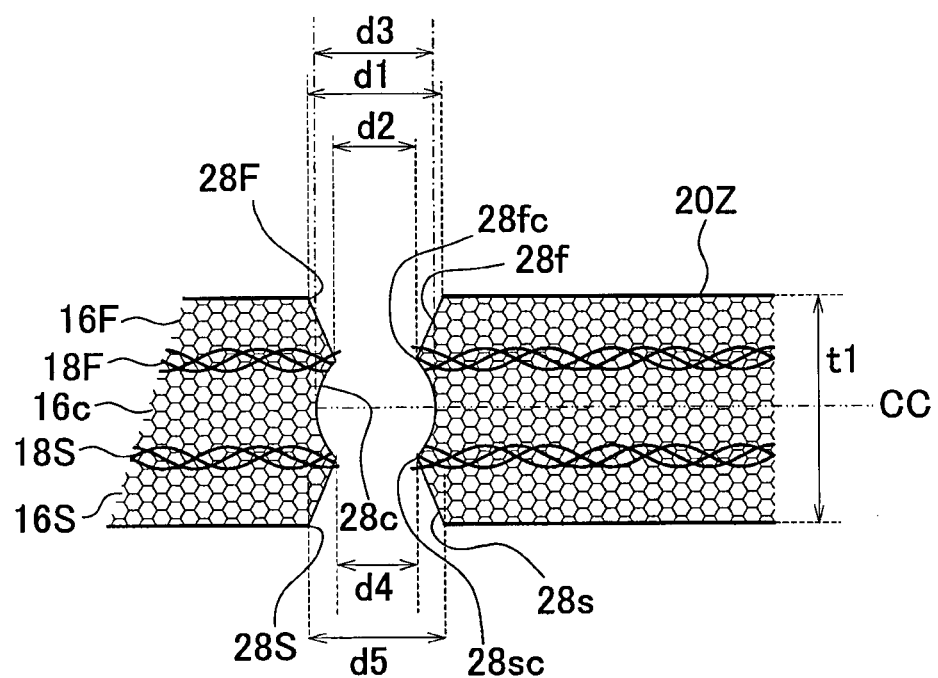
FIG. 8 is a magnified cross-sectional view of a penetrating hole.

FIG. 7 and FIG. 8 are magnified cross-sectional views of the through-hole conductor 36 and the penetrating hole 28 of the printed wiring board 10 illustrated in FIG. 6, respectively.

The insulating substrate 30 includes multiple sheets of inorganic fibers (reinforcement material) and resin; the inorganic fibers are arranged in the insulating substrate 30 to be substantially parallel to the first surface, and the third opening portion (28c) is located between the adjacent reinforcement materials. As the inorganic fibers, a nonwoven fabric of glass fibers or aramid fibers is preferred, and glass cloth, which is a nonwoven fabric of glass fibers, is particularly preferred.

When the insulating substrate 30 is formed with resin and two sheets of inorganic fibers, an insulating substrate (20Z) of the insulating substrate 30 is formed by interposing a first resin layer (16c) between two sheets of inorganic fibers, namely, a first sheet of inorganic fibers (first reinforcement material) (18F) and a second sheet of inorganic fibers (second reinforcement material) (18S), and by forming a second resin layer (16F) on the surface (F) side of the first sheet of inorganic fibers (18F) and also by forming a third resin layer (16S) on the surface (S) side of the second sheet of inorganic fibers (18S).

The inorganic fibers (reinforcement material) protrude into the through-hole conductor 36 formed on an inner wall of the first opening portion (28f) or the second opening portion (28s), but do not protrude into the through-hole conductor 36 formed on an inner wall of the third opening portion (28c). The third opening portion (28c) of the penetrating hole 28 is formed in the first resin layer (16c), sandwiched between the first and second sheets of inorganic fibers (18F, 18S). It is preferred that a portion of the first inorganic fibers (18F) protrude through the inner wall of the first opening portion (28f) and that a portion of the second inorganic fibers (18S) protrude through the inner wall of the second opening portion (28s). However, it is preferred that none of the inorganic fibers protrude into the third opening portion (28c).

Since the third opening portion (28c) is formed in the first resin layer (16c), none of the inorganic fibers exists inside the third opening portion (28c). That is, the inorganic fibers protrude through each inner wall of the first and second opening portions (28f, 28s), but no inorganic fiber protrudes into the third opening portion (28c). Because of the lack of inorganic fibers, the third opening portion (28c) can have a diameter greater than the minimum diameter of either of the first and second opening portions (28f, 28s) despite its position in a central part of the insulating substrate.

The penetrating hole 28 is made up of the first opening portion (28f) that opens on the first-surface (F) side, the second opening portion (28s) that opens on the second-surface (S) side, and the third opening portion (28c) connecting the first and second opening portions (28f, 28s) to each other, and is characterized by the maximum diameter of the third opening portion (28c) being greater than the minimum diameter of either of the first and second opening portions (28f, 28s). The penetrating hole 28 is formed such that the first opening portion (28f) on the first-surface (F) side has first opening (28F) having a maximum diameter (d1) of (80 μm) and a second opening (28fc) having a minimum diameter (d2) of (50 μm), while the second opening portion (28s) on the second-surface (S) side has second opening (28S) having a maximum diameter (d5) of (80 μm) and a second opening (28sc) having a minimum diameter (d4) of (50 μm). The third opening portion (28c) is formed with a maximum diameter (d3) of (60 μm) (see FIG. 8). In the printed wiring board of the first embodiment, the third opening portion (28c) is set to have a maximum diameter (d3) greater than the minimum diameter (d2) of the first opening portion (28f) or the minimum diameter (d4) of the second opening portion (28s). Thus, stress does not concentrate on one part of the through-hole conductor 38 formed in the penetrating hole 28 by being plated, but is dispersed. As a result, problems such as disconnection and the like caused by conductor breakage are suppressed and connection reliability is enhanced.

The center (CC) of the third opening portion (28c) in a thickness direction of the insulating substrate (20Z) is positioned in the center of the insulating substrate in the thickness direction. Stress does not concentrate on one part of the through-hole conductor 38 formed in the penetrating hole 28 by being plated, but is dispersed.

Figure 9:
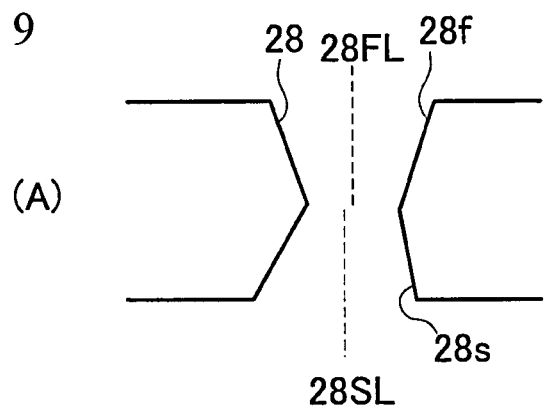
FIGS. 9A to 9C are explanatory drawings of the penetrating hole according to the first embodiment.
Figure 9:
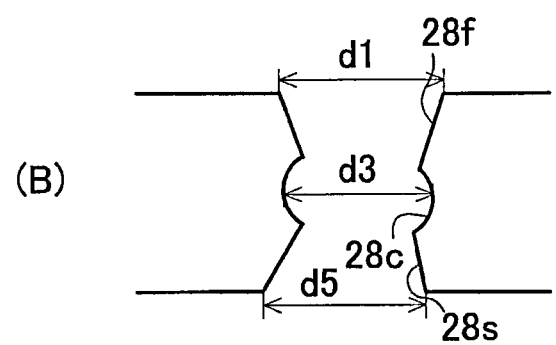
Figure 9:
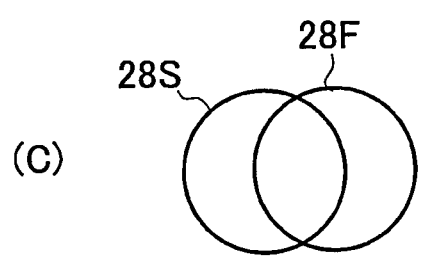

As illustrated in FIG. 9A, a first normal line (28FL), which passes through the center of the first opening (28F) and is perpendicular to the first surface (F) of insulating substrate 30, and a second normal line (28SL), which passes through the center of the second opening (28S) and is perpendicular to the second surface (S) of the insulating substrate 30, are shifted from each other. As illustrated in FIG. 9B, a portion where the first and second opening portions (28f, 28s) are connected to each other as shown in FIG. 9A is enlarged, and the enlarged portion becomes the third opening portion (28c). When the first and second normal lines (28FL, 28SL) are shifted from each other, the maximum diameter of the third opening portion (28c) becomes greater compared with the maximum diameter when those normal lines are not shifted from each other. Therefore, it is thought that stress tends not to concentrate on the through-hole conductor 36, and disconnection and the like thereof are suppressed. Accordingly, connection reliability is enhanced.

The first opening portion (28f) tapers from the first surface (F) toward the second surface (S), and the second opening portion (28s) tapers from the second surface (S) toward the first surface (F), and the first and second opening portions (28f, 28s) are connected to each other by the third opening portion (28c) in substantially the central part of the insulating substrate. The first and second opening portions (28f, 28s) taper to form two boundaries, respectively, with the third opening portion (28c). Since the first and second opening portions (28f, 28s) each have the minimum diameter at their respective boundaries, the penetrating hole 28 is blocked at the two opening portions having the minimum diameter when the penetrating hole 28 is filled with plating. Thus, the first, second and third opening portions (28f, 28s, 28c) are surely filled with plating.

It is preferred that the third opening portion (28c) be positioned in substantially the central part of the insulating substrate 30 in a thickness direction (see FIG. 7 and FIG. 8), and the center of the third opening portion (28c) in a thickness direction of the insulating substrate be positioned in substantially the central part in a thickness direction of the insulating substrate. It is thought that the conductor volume in a thickness direction of the insulating substrate 30 becomes substantially uniform and warping is suppressed.

It is preferred that portions of the inorganic fibers be positioned on the inner walls of the first and second opening portions (28f, 28s). By so structuring, when the first and second opening portions are filled with plating, the portions of the inorganic fibers protrude into the through-hole conductor 36, and it is thought that the adhesion between the through-hole conductor 36 and the insulating substrate is enhanced due to an anchoring effect.

Figure 13:
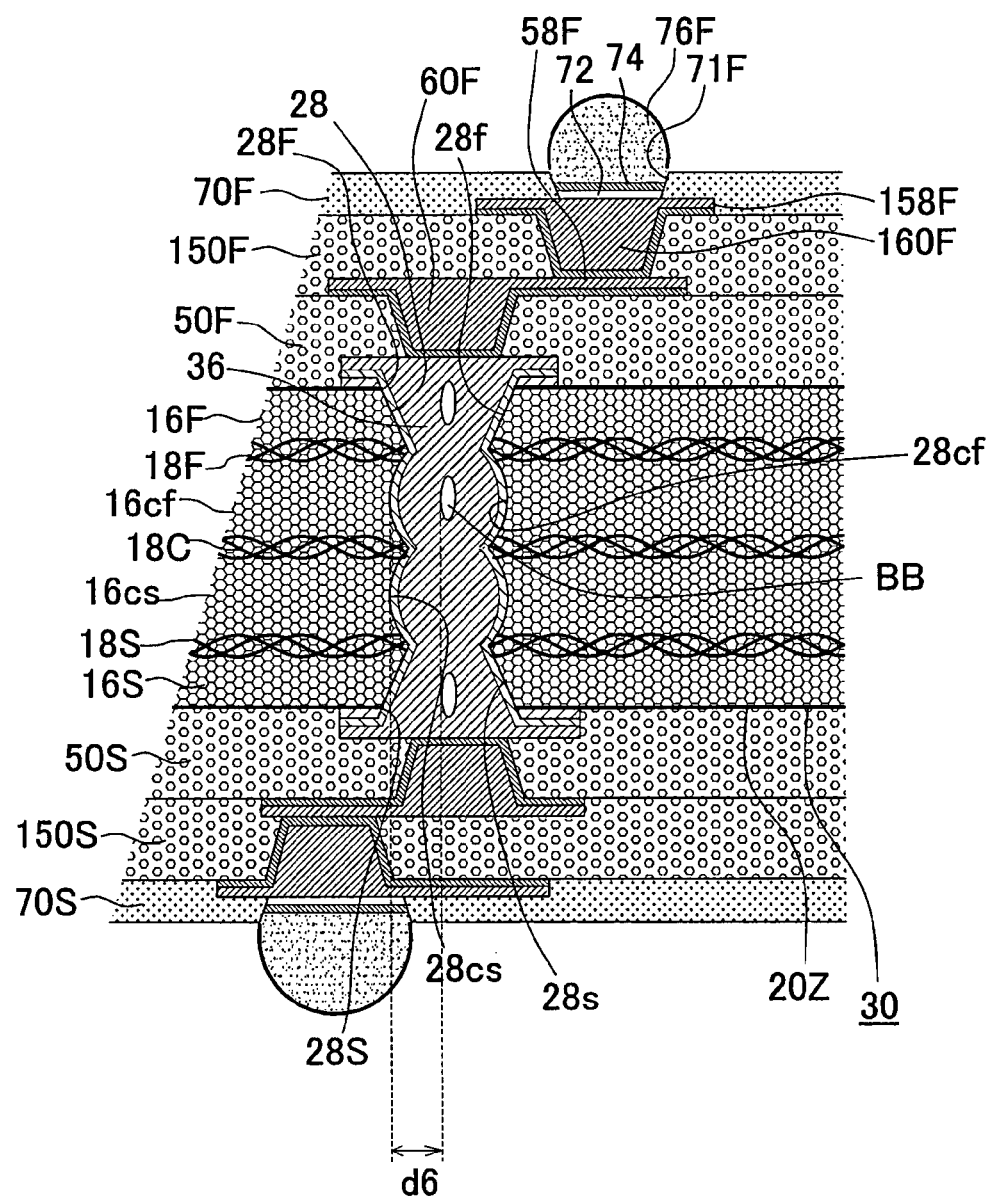
FIG. 13 is a magnified cross-sectional view of a through-hole conductor in the printed wiring board according to a modified example of the second embodiment.

The through-hole conductor 36 may have a hollow portion (BB) as illustrated in FIG. 13. In such a case, the minimum distance (d6) from the inner wall of the penetrating hole 28 to a hollow portion (BB), that is, the thickness of the through-hole conductor 36, is preferred to be no less than 8 μm. Even when the first, second and third opening portions (28f, 28s, 28c) each have a hollow portion (BB), it is preferred that the thickness from the inner wall of each of the opening portions to the hollow portions (BB) be no less than 8 μm. When the thickness of the through-hole conductor 36 is less than 8 μm, it is thought that breakage or the like due to stress may occur, causing reduction in connection reliability. When the thickness of the through-hole conductor 36 is no less than 8 μm, breakage or the like due to stress does not occur and high connection reliability is attained.

When a hollow portion (BB) exists in first, second or third opening portion (28f, 28s, 28c), the hollow portion (BB) is preferred to exist independently in the opening portion. If a hollow portion (BB) exists spanning more than one opening portion, the volume of the through-hole conductor 36 decreases, and breakage or the like caused by stress may occur and reduce connection reliability.

The thickness (t1) of the insulating substrate is preferred to be 100 to 300 μm. When the thickness (t1) of the insulating substrate is less than 100 μm, warping due to stress tends to occur. On the other hand, if the thickness (t1) of the insulating substrate exceeds 300 μm when the entire thickness of a printed wiring substrate is no greater than 500 μm, the layer thickness of laminated interlayer insulation layers becomes thin, and it is thought that the insulation between the conductive patterns across interlayer insulation layers may have a problem.

A method for manufacturing the printed wiring board 10 described above by referring to FIG. 6 and FIG. 7 are illustrated in FIGS. 1A, 1B, 1C and 1D to FIG. 6.

(1) A copper-clad laminate in which 15 μm-thick copper foil 22 is laminated on both sides of a 200 μm-thick insulating substrate (20Z) made of glass epoxy resin or BT (bismaleimide triazine) resin is set as a starting material. As described above, the insulating substrate (20Z) is formed by interposing a first resin layer (16c) between two sheets of glass cloth (inorganic fibers) (18F, 18S), and by covering the glass cloth (18F) with a second resin layer (16F) on the surface (F) side while covering the glass cloth (18S) with a third resin layer (16S) on the surface (S) side. First, a black-oxide treatment is conducted in which the surface of the copper foil 22 is subjected to a blackening bath (oxidizing bath) using a solution containing NaOH (10 g/L), NaClO$_2$ (40 g/L), and Na$_3$PO$_4$ (6 g/L) (see FIG. 1A).

(2) A first opening portion (28f) for forming a penetrating hole for a through hole is formed on the first-surface (F) side of the insulating substrate 30 by irradiating a CO2 laser along a normal line from the first-surface (F) of the insulating substrate 30 toward the second surface (S) (see FIG. 1B). The number of shots is one at this time. The first opening portion (28f) has a first opening (28F) on the first surface (F) and tapers from the first opening (28F) toward the second surface (S).

(3) By irradiating a CO2 laser at the second surface (S) of the insulating substrate 30 orthogonally from the second surface (S) toward the first surface (F) under the same conditions as with forming the first opening portion (28f), a second opening portion (28s) having a portion connected to the first opening portion (28f) is formed (see FIG. 1C). The number of shots is one at this time. The second opening portion (28s) has a second opening (28S) on the second surface (S) and tapers from the second opening (28S) toward the first surface (F).

(4) On the second-surface (S) side of the insulating substrate 30, the CO2 laser is irradiated at the connection portion between the first and second opening portions (28f, 28s) from the second surface (S) toward the first surface (F), and the portion where the first and second opening portions (28f, 28s) are connected to each other is enlarged so as to form a third opening portion (28c) (see FIG. 1D). The number of shots is one at this time.

In FIG. 8, the insulating substrate 30 having the penetrating hole 28 is illustrated in a magnified view. A cross section of the penetrating hole 28 before the formation of the third opening portion (28c) is illustrated in FIG. 9A, and a cross section of the penetrating hole 28 after the formation of the third opening portion (28c) is illustrated in FIG. 9B. Due to the third opening portion (28c), the minimum diameter (30 μm) of the penetrating hole 28 is enlarged to diameter (d3) (60 μm). Since the third portion (28c) is formed by irradiating a laser at the first resin layer (16c) sandwiched between the first and second sheets of inorganic fiber (18F, 18S), the third opening portion (28c) is formed to have a diameter greater than either of the first minimum opening (28fc) of the first opening portion (28f) and the second minimum opening (28sc) of the second opening portion (28s). The first resin layer (16c) is decomposed much more than the inorganic fibers due to having higher energy absorptivity and lower laser reflectance as compared with the inorganic fibers. Thus, the maximum diameter of the third opening portion (28c) becomes greater than the minimum diameter of either of the first and second opening portions (28f, 28s).

The aperture diameters of the first and second opening portions (28f, 28s) are set to be the same, which is one of the laser conditions. The aperture diameter set for the third opening portion (28c) is preferred to be the same as that for forming the first and second opening portions (28f, 28s). When the third opening portion (28c) is formed, if the aperture diameter is set to be greater than that for forming the first and second opening portions (28f, 28s), it is thought that the connection portion may be opened widely and cause the penetrating hole 28 to become cylindrical, which is difficult to fill with plating. On the other hand, if the aperture diameter is set to be smaller than the aperture diameter for forming the first and second opening portions (28f, 28s), the maximum diameter of the third opening portion (28c) cannot be formed greater than the minimum diameter of either of the first and second opening portions (28f, 28s).

Among the laser conditions for forming the third opening portion (28c), the pulse width is preferred to be the same as or narrower than that for forming the first and second opening portions (28f, 28s). Since the first and second opening portions (28f, 28s) are already connected to each other, the pulse width for forming the third opening portion (28c) is allowed to be narrower.

As illustrated in FIG. 9A and FIG. 9C, a first normal straight line (28FL), which passes through the center of the first opening (28F) and is perpendicular to the first surface (F) of the insulating substrate 30, and a second normal straight line (28SL), which passes through the center of the second opening (28S) and is perpendicular to the second surface (S) of the insulating substrate 30, may be shifted from each other. Since the third opening portion (28c) is formed by being irradiated with a CO2 laser, a sufficient opening is obtained.

(5) After the penetrating hole 28 has been subjected to desmearing treatment using permanganic acid, an electroless plated film 31 is formed by performing electroless plating (see FIG. 2A).

(6) A plating resist 40 having a predetermined pattern is formed on the electroless plated film 31 on the surface of the insulating substrate 30 (see FIG. 2B).

(7) By performing electrolytic plating, an electrolytic plated film 32 is formed on the area without the plating resist 40, and a through-hole conductor 36 is also formed by filling the penetrating hole 28 with plating (see FIG. 2C). In the first embodiment, the first and second opening portions (28f, 28s) each have the minimum diameters in the vicinity of the border with the third opening portion (28c), and the penetrating hole is blocked at the minimum diameters. Since plating is performed taking the blocked minimum diameters as a bottom portion, it is thought that such a structure is advantageous when filling the penetrating hole with plating.

(8) The plating resist 40 is removed, the electroless plated film 31 and the copper foil 22 under the plating resist 40 are removed by etching, conductive patterns (34F, 34S) and the through-hole conductor 36 are formed, and the insulating substrate 30 is completed (see FIG. 3A).

(9) On both sides of the insulating substrate 30 after the above processes, 35 μm-thick resin films for interlayer insulation layers with a slightly larger size than the insulating substrate 30 are laminated under pressurized vacuum conditions while raising temperature, and interlayer insulation layers 50 are provided (see FIG. 3B). The interlayer insulation layers 50 are each formed with resin and inorganic filler (for example, ABF), in this embodiment. However, that is not the only option, and a prepreg formed by impregnating glass cloth with resin containing inorganic filler may also be used for the interlayer insulation layer. In such a case, a copper foil having a thickness of 10 to 25 μm is laminated on the interlayer insulation layer.

(10) Next, via opening portions 51 each having a diameter of 70 μm are formed in the interlayer insulation layers 50 by using a CO2 gas laser (see FIG. 3C). The surfaces of the interlayer insulation layers 50 are each roughened by being immersed in an oxidizing agent such as chromic acid, permanganate or the like (not illustrated). In the case of the interlayer insulation layer in which copper foil is laminated on prepreg, the surface of the copper foil is subjected to a blackening treatment and the via opening portion is formed using a laser.

(11) The interlayer insulation layers 50 are each provided with a catalyst such as palladium or the like on the surface thereof in advance, and are immersed in an electroless plating liquid for 5 to 60 minutes. Accordingly, an electroless plated film 52 in a range of 0.1 to 5 μm is formed (see FIG. 3D). In the case of the interlayer insulation layer in which copper foil is laminated on prepreg, the electroless plated film 52 is formed on the copper foil and on the inner walls of the openings (51F, 51S).

(12) A commercially available photosensitive dry film is laminated on the substrate 30 after the above treatment, and is exposed to light after a photo mask film is placed thereon. Then, a development process is conducted using sodium carbonate to provide a 15 μm-thick plating resist 54 (see FIG. 4A).

(13) A 15 μm-thick electrolytic plated film 56 is formed on the electroless plated film 52 through an electrolytic plating treatment (see FIG. 4B).

(14) After the plating resist 54 has been removed using 5% NaOH, the electroless plated film 52 between portions of the electrolytic plated film is removed by being dissolved through etching using a mixed solution of nitric acid, sulfuric acid and hydrogen peroxide. Accordingly, conductive layers (58F, 58S) with a thickness of 15 μM and via conductors (60F, 60S) are formed, being made up of the electroless plated film 52 and the electrolytic plated film 56 (see FIG. 4C). In the case of the interlayer insulation layer in which copper foil is laminated on the prepreg, the conductive layers (58F, 58S) are each made up of the copper foil, the electroless plated film 52 and the electrolytic plated film 56. The surfaces of the conductive layers (58F, 58S) and the via conductors (60F, 60S) are roughened using etchant containing a cupric complex and an organic acid (not illustrated).

(15) In the same manner as in (9) to (14) described above, an interlayer insulation layer (150F) is formed having a conductive layer (158F) and a via conductor (160F), and an interlayer insulation layer (150S) is formed having a conductive layer (158S) and a via conductor (160S) (see FIG. 5A).

(16) By applying a commercially available solder resist composition and by performing exposure and developing treatments, solder resist layers (70F, 70S) with opening portions (71F, 71S) are formed (see FIG. 5B).

(17) On each of the opening portions (71F, 71S), a 5 µm-thick nickel-plated layer 72 is formed by immersing the substrate in an electroless nickel plating solution. Further, on the nickel-plated layer 72, a 0.03 µm-thick gold-plated layer 74 is formed by immersing the substrate in an electroless gold plating solution (see FIG. 5C). Other than the nickel/gold layers, nickel/palladium/gold layers may also be formed.

(18) Next, a solder ball is placed on each of the opening portions (71F, 71S), and solder bumps (76F, 76S) are formed on the first-surface (F) (upper surface) side and the second-surface (S) (lower surface) side, respectively. Accordingly, the printed wiring board 10 is completed (see FIG. 6).

Second Embodiment

A printed wiring board according to a second embodiment of the present invention is described with reference to the cross-sectional views shown in FIG. 11 and FIG. 12.

Figure 11:
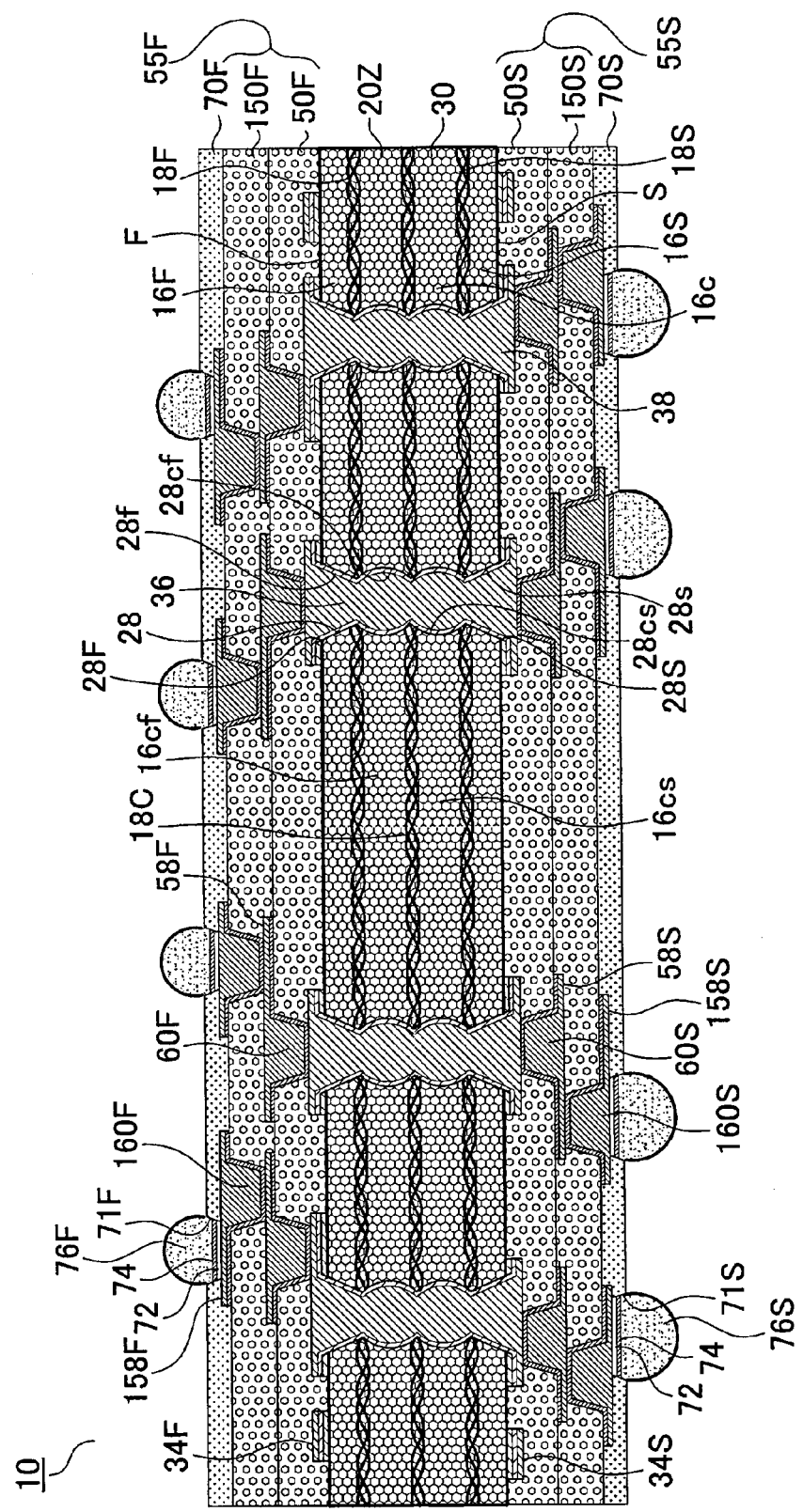
FIG. 11 is a cross-sectional view of the printed wiring board of the second embodiment.
Figure 12:
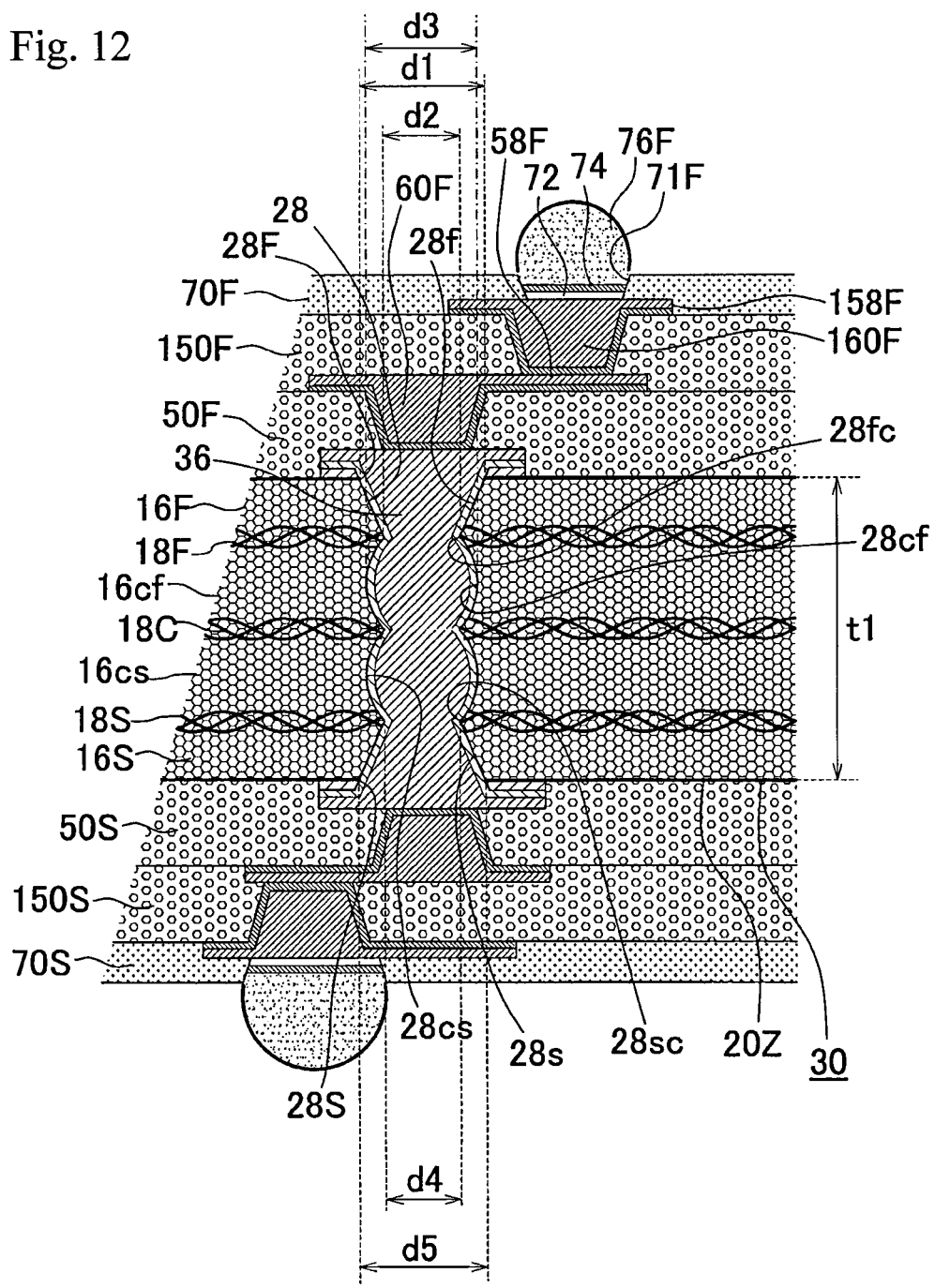
FIG. 12 is a magnified cross-sectional view of a through-hole conductor in the printed wiring board illustrated in FIG. 11.

FIG. 11 illustrates the printed wiring board 10 in a state before an IC chip is mounted. The printed wiring board 10 is formed by respectively laminating interlayer insulation layers (50F, 50S, 150F, 150S) and conductive layers (58F, 58S, 158F, 158S) on both sides of an insulating substrate 30.

In the second embodiment, an insulating substrate 30 is made of resin and three sheets of inorganic fibers (reinforcement material): first inorganic fibers (first reinforcement material) (18F), second inorganic fibers (second reinforcement material) (18S) and third inorganic fibers (third reinforcement material) (18C). The insulating substrate 30 is formed by interposing the third inorganic fibers (18C) between a fourth resin layer (16cf) and a fifth resin layer (16cs), by covering the surface (F) side of the fourth resin layer (16cf) with the first inorganic fibers (18F), by covering the surface (S) side of the fifth resin layer (16cs) with the second inorganic fibers (18S), by covering the surface (F) side of the first inorganic fibers (18F) with a second resin layer 16F, and by covering the surface (S) side of the second inorganic fibers (18S) with a third resin layer (16S).

The thickness (t1) of the insulating substrate is preferred to be 100 to 300 µm. When the thickness (t1) of the insulating substrate is less than 100 µm, warping caused by stress tends to occur. On the other hand, if the thickness (t1) of the insulating substrate exceeds 300 µm when the entire thickness of a printed wiring substrate is no greater than 500 µm, the layer thickness of laminated interlayer insulation layers becomes thin, and it is thought that the insulation between the conductive patterns between interlayer insulation layers may have a problem.

A penetrating hole 28 is made up of a first opening portion (28f) with a first opening (28F) on the first-surface (F) (upper surface) side, a second opening portion (28s) with a second opening (28S) on the second-surface (S) (lower surface) side, and fourth and fifth opening portions (28cf, 28cs) which are portions enlarged by a laser and are connected to the first and second opening portions (28f, 28s), respectively. The first opening portion (28f) tapers from the first surface toward the second surface and the second opening portion (28s) tapers from the second surface toward the first surface. The first and fourth opening portions (28f, 28cf) as well as the second and fifth opening portions (28c, 28cs) are respectively connected to each other in the insulating substrate, while the fourth and fifth opening portions (28cf, 28cs) are connected in substantially the central part of the insulating substrate. By being so structured, the first and second opening portions (28f, 28s) are connected to each other through the fourth opening portion (28cf) and the fifth opening portion (28cs) in the insulating substrate 30.

The boundary (first minimum opening 28fc) between the first and fourth opening portions (28f, 28cf) and the boundary (second minimum opening 28sc) between the second and fifth opening portions (28s, 28cs) are located where the opening diameters of the first and second opening portions (28f, 28s), respectively, become minimum. The maximum diameter of the fourth opening portion (28cf) is greater than the minimum diameter of either of the first and second opening portions (28f, 28s), and the maximum diameter of the fifth opening portion (28cs) is also greater than the minimum diameter of either of the first and second opening portions (28f, 28s). A through-hole conductor 36 is formed by filling the penetrating hole 28 with plating.

No inorganic fibers exist on the inner walls the fourth and fifth opening portions (28cf, 28cs). That is, the inorganic fibers protrude through the inner walls of the first and second opening portions (28f, 28s), but the inorganic fibers do not protrude into the fourth and fifth opening portions (28cf, 28cs).

In the penetrating hole 28, the first opening portion (28f) on the first-surface (F) side is formed to have the opening (28F) with a maximum diameter (d1) of (80 µm) and the first minimum opening (28fc) with a diameter (d2) of (50 µm); the second opening portion (28s) on the second-surface (S) side is formed to have the opening (28S) with a maximum diameter d5 of (80 µm) and the second minimum opening (28sc) with a diameter (d4) of (50 µm); and the fourth and fifth opening portions (28cf, 28cs) are each formed to have a maximum diameter (d3) of (60 µm). The diameter of the portion where the fourth and fifth opening portions (28cf, 28cs) are connected to each other is set to be substantially equal to the minimum diameter (50 µm) of the first and second opening portions.

The boundary (first minimum opening 28fc) between the first and fourth opening portions (28f, 28cf) and the boundary (second minimum opening 28sc) between the second and fifth opening portions (28s, 28cs) are located where the opening diameters of the first and second opening portions (28f, 28s), respectively, become minimum. The diameter of the portion where the fourth and fifth opening portions (28cf, 28cs) are connected to each other is smaller than the maximum diameter of either of the fourth and fifth opening portions (28cf, 28cs), and is approximately equal to the minimum diameters of the first and second opening portions (28f, 28s), respectively. Accordingly, the penetrating hole 28 is blocked at the three opening portions, each having a small diameter, when the penetrating hole 28 is filled with plating. Accordingly, the first, second, third, fourth and fifth opening portions (28f, 28s, 28c, 28cf, 28cs) are securely filled with plating.

The fourth opening portion (28cf) of the penetrating hole 28 is formed in the fourth resin layer (16cf) interposed between the first and third sheets of inorganic fibers (18F, 18C), and the fifth opening portion (28cs) is formed in the fifth resin layer (16cs) interposed between the second and third sheets of inorganic fibers (18S, 18C). Accordingly, no inorganic fibers exist on the inner walls of the fourth and fifth opening portions (28cf, 28cs) except for a portion of the third sheet of inorganic fibers (18C) where the fourth and fifth opening portions (28cf, 28cs) are connected to each other. Due to lack of the inorganic fibers, the fourth and fifth opening portions (28cf, 28cs) are each formed to have a diameter greater than the minimum diameter of either of the first and second opening portions (28f, 28s) despite their locations at substantially a central part of the insulating substrate 30.

A first normal line (28FL), which is a straight line passing through the center of the first opening (28F) and being perpendicular to the first surface (F) of the insulating substrate 30, and a second normal line (28SL), which is a straight line passing through the center of the second opening (28S) and being perpendicular to the second surface (S) of the insulating substrate 30, may be shifted from each other. The portion where the first and second opening portions (28f, 28s) are connected to each other is enlarged, and the fourth and fifth opening portions (28cf, 28cs) are thereby each formed. When the first and second normal lines (28FL, 28SL) are shifted from each other, since the maximum diameter of each of the fourth and fifth opening portions (28cf, 28cs) becomes greater than when those normal lines are not shifted or not aligned, it is thought that hardly any stress concentrates on the through-hole conductor 36 and disconnection or the like is suppressed from occurring. As a result, connection reliability is enhanced.

The through-hole conductor 36 may have a hollow portion (BB) therein as illustrated in FIG. 13. In such a case, it is preferred that the minimum distance (d6) from the inner wall of the penetrating hole 28 to hollow portion (BB), that is, the thickness of the through-hole conductor 36, be no less than 8 μm. Even when the first, second, third, fourth and fifth opening portions (28f, 28s, 28c, 28cf, 28cs) each have a hollow portion (BB), it is preferred that the distance from the inner wall of each of the opening portions to a hollow portion (BB) be no less than 8 μm. When the thickness of the through-hole conductor 36 is less than 8 μm, it is thought that breakage due to stress may occur and cause a reduction in connection reliability. When the thickness of the through-hole conductor 36 is greater than 8 μm, breakage due to stress does not occur and high connection reliability is attained. When a hollow portion (BB) exists in the first, second, third, fourth or fifth opening portion (28f, 28s, 28c, 28cf, 28cs), such a hollow portion is preferred to be positioned independently in an opening portion. If a hollow portion (BB) exists spanning more than one opening portion, the volume of the through-hole conductor 36 is decreased, and breakage or the like due to stress may occur and reduce connection reliability.

Figure 10:
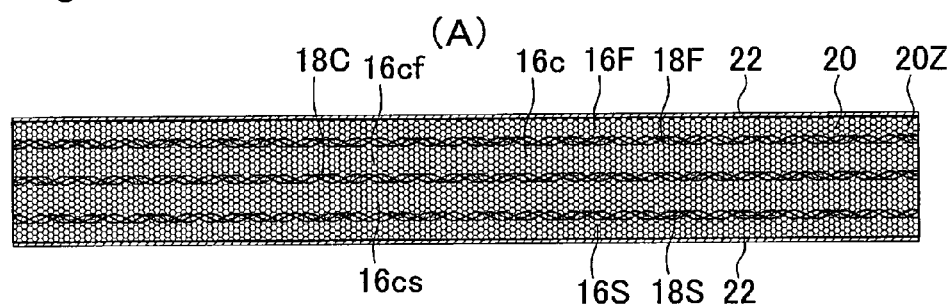
FIGS. 10A and 10B are process drawings illustrating the method for manufacturing a printed wiring board of a second embodiment of the invention.
Figure 10:
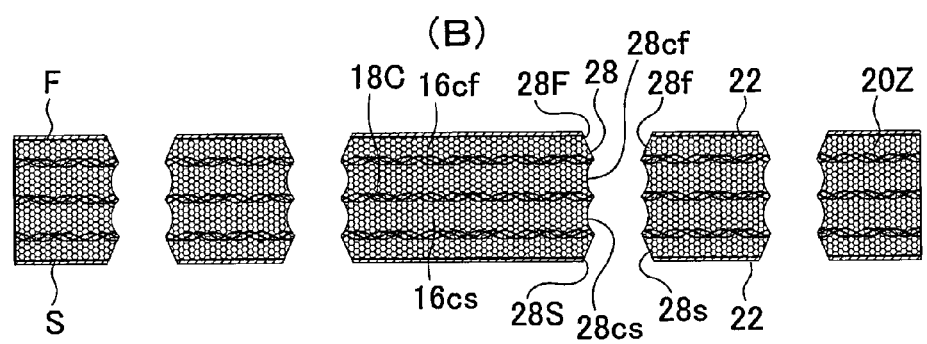

FIGS. 10A and 10B illustrate a method for manufacturing the printed wiring board 10 of the second embodiment.

(1) A copper-clad laminate in which 15 μm-thick copper foil 22 is laminated on both sides of a 200 μm-thick insulating substrate (20Z) made of glass epoxy resin or BT (bismaleimide triazine) resin is set as a starting material (see FIG. 10A). As described above, the insulating substrate (20Z) includes three sheets of glass cloth (inorganic fibers) (18F, 18C, 18S).

(2) A first opening portion (28f) is formed on the first-surface (F) side of the insulating substrate 30 by irradiating a CO2 laser from the first surface (F) toward the second surface (S), and a second opening portion (28s) connected to the first opening portion (28f) is formed by irradiating a CO2 laser from the second surface (S) toward the first surface (F) under the same conditions as with forming the first opening portion (28f). On the second-surface (S) side of the insulating substrate 30, the CO2 laser is irradiated from the second surface (S) toward the first surface (F) and the portion connecting the first and second opening portions (28f, 28s) is enlarged. Accordingly, fourth and fifth opening portions (28cf, 28cs) are formed (see FIG. 10B). Since subsequent processes are the same as with the first embodiment, their descriptions are omitted here.

FIG. 13 illustrates a modified example of the second embodiment. In the modified example of the second embodiment, a hollow portion (BB) is included in the through-hole conductor 36. Here, it is preferred that the minimum distance (d6) from the inner wall of the penetrating hole 28 to a hollow portion (BB), that is, the thickness of the through-hole conductor 36, be no less than 8 μm. When the thickness of the through-hole conductor 36 is less than 8 μm, it is thought that breakage due to stress may occur and cause a reduction in connection reliability. When the thickness of the through-hole conductor 36 is greater than 8 μm, breakage due to stress does not occur and high connection reliability is attained.

It is noted that, in the first embodiment as well, if the minimum distance (d6) from the inner wall of the penetrating hole 28 to a hollow portion (BB), that is, the thickness of the through-hole conductor 36, is no less than 8 μm, a reduction in reliability can be avoided, and the insulating substrate 30 is therefore considered to be a non-defective item, as with the second embodiment.

When a through-hole conductor is formed by filling a penetrating hole with plating and has a minimum-diameter portion in a central part of the insulating substrate, stress can concentrate on the minimum-diameter portion of the through-hole conductor and may result in disconnection of the conductor due to breakage thereof, thus causing a reduction in the reliability of the through-hole conductor. In addition, when positions to bore openings for a penetrating hole using a laser in the upper and lower sides of the insulating substrate are shifted from each other, the formation of the penetrating hole becomes difficult.

A printed wiring board according to an embodiment of the present invention has a highly reliable through-hole conductor, and a method for manufacturing a printed wiring board according to an embodiment of the present invention provides a printed wiring board having a highly reliable through-hole conductor.

A printed wiring board according to an embodiment of the present invention has: an insulating substrate that is provided with a penetrating hole and has a first surface and a second surface opposite the first surface; a first conductive pattern formed on the first surface; a second conductive pattern formed on the second surface; and a through-hole conductor that is formed in the penetrating hole and connects the first conductive pattern and the second conductive pattern. In such a printed wiring board, the penetrating hole includes a first opening portion that opens on the first surface, a second opening portion that opens on the second surface, and a third opening portion connecting the first and second opening portions to each other, and the maximum diameter of the third opening portion is greater than the minimum diameter of either of the first and second opening portions.

A method for manufacturing a printed wiring board according to an embodiment of the present invention includes: forming a penetrating hole in an insulating substrate having a first surface and a second surface opposite the first surface; forming a first conductive pattern on the first surface; forming a second conductive pattern on the second surface; and by forming a plated layer in the penetrating hole with plating, forming a through-hole conductor that connects the first conductive pattern and the second conductive pattern to each other. In such a method, the forming of a penetrating hole includes forming a first opening portion having a first opening on the first surface, forming a second opening portion having a second opening on the second surface, and forming a third opening portion between the first and second opening portions so as to connect the first and second opening portions to each other. In addition, the maximum diameter of the third opening portion is made greater than the minimum diameter of either of the first and second opening portions.

In a printed wiring board according to an embodiment of the present invention, the maximum diameter of the third opening portion, which connects the first and second opening portions to each other, is greater than the minimum diameter of either of the first and second opening portions. When stress is exerted on a printed wiring board according to an embodiment of the present invention, the stress does not concentrate on one part of the through-hole conductor, but is thought to be dispersed throughout through-hole conductor. As a result, disconnection due to breakage thereof is thought to be suppressed, and the connection reliability of the through-hole conductor is enhanced.

In a method for manufacturing a printed wiring board according to an embodiment of the present invention, a penetrating hole for forming a through-hole conductor is made up of a first opening portion and a second opening portion, which are each tapered toward a central part of the insulating substrate, and of a third opening portion connecting the first and second opening portions to each other. The maximum diameter of the third opening portion is made greater than the minimum diameter of either of the first and second opening portions, and the first and second opening portions are connected to the third opening portion, thereby enhancing the connection reliability of the through-hole conductor formed with plating.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
an insulating substrate having a penetrating hole formed through the insulating substrate;
a first conductive pattern formed on a first surface of the insulating substrate;
a second conductive pattern formed on a second surface of the insulating substrate on an opposite side with respect to the first surface of the insulating substrate; and
a through-hole conductor formed in the penetrating hole in the insulating substrate such that the through-hole conductor is connecting the first conductive pattern on the first surface of the insulating substrate and the second conductive pattern on the second surface of the insulating substrate,
wherein the penetrating hole has a first opening portion opening on the first surface of the insulating substrate, a second opening portion opening on the second surface of the insulating substrate and a third opening portion connecting the first opening portion and the second opening portion, the third opening portion has the maximum diameter which is greater than the minimum diameter of the first opening portion and the minimum diameter of the second opening portion, and the insulating substrate comprises a resin material and a plurality of sheets each comprising a reinforcement material.

2. The printed wiring board according to claim 1, wherein the first opening portion of the penetrating hole is formed such that the first opening portion is tapering from the first surface toward the second surface of the insulating substrate, and the second opening portion of the penetrating hole is formed such that the second opening portion is tapering from the second surface toward the first surface of the insulating substrate.

3. The printed wiring board according to claim 1, wherein the third opening portion has the center with respect to a thickness direction of the insulating substrate such that the center of the third opening portion is positioned in substantially a central portion of the insulating substrate with respect to the thickness direction of the insulating substrate.

4. The printed wiring board according to claim 1, wherein the plurality of sheets comprises two sheets each comprising the reinforcement material.

5. The printed wiring board according to claim 1, wherein the plurality of sheets comprises three sheets each comprising the reinforcement material.

6. The printed wiring board according to claim 1, wherein the insulating substrate is formed such that the sheets of the reinforcement material are extending substantially parallel to the first surface of the insulating substrate, and the third opening portion of the penetrating hole is formed between two of the sheets of the reinforcement material.

7. The printed wiring board according to claim 1, wherein the penetrating hole in the insulating substrate is formed such that a portion of each of the sheets of the reinforcement material is extending inside the penetrating hole in the insulating substrate.

8. The printed wiring board according to claim 1, wherein the penetrating hole in the insulating substrate is formed such that a portion of each of the sheets of the reinforcement material is extending inside the penetrating hole in the insulating substrate and into the through-hole conductor in the first opening portion and the second opening portion.

9. The printed wiring board according to claim 1, wherein the first opening portion and the second opening portion of the penetrating hole are positioned such that a normal line passing perpendicular to the first surface of the insulating substrate and the center of an opening of the first opening portion on the first surface of the insulating substrate is shifted from a normal line passing perpendicular to the first surface of the insulating substrate and the center of an opening of the second opening portion on the second surface of the insulating substrate.

10. The printed wiring board according to claim 1, wherein the through-hole conductor has at least one hollow portion formed in the through-hole conductor.

11. The printed wiring board according to claim 1, wherein the through-hole conductor has at least one hollow portion formed in the through-hole conductor inside the third opening portion of the penetrating hole.

12. The printed wiring board according to claim 1, wherein the insulating substrate has a thickness in a range of 100 μm to 300 μm.

13. A printed wiring board, comprising:
an insulating substrate having a penetrating hole formed through the insulating substrate;
a first conductive pattern formed on a first surface of the insulating substrate;
a second conductive pattern formed on a second surface of the insulating substrate on an opposite side with respect to the first surface of the insulating substrate; and
a through-hole conductor formed in the penetrating hole in the insulating substrate such that the through-hole conductor is connecting the first conductive pattern on the first surface of the insulating substrate and the second conductive pattern on the second surface of the insulating substrate and that the through-hole conductor has at least one hollow portion formed in the through-hole conductor,
wherein the penetrating hole has a first opening portion opening on the first surface of the insulating substrate, a second opening portion opening on the second surface of the insulating substrate and a third opening portion connecting the first opening portion and the second opening portion, and the third opening portion has the maximum diameter which is greater than the minimum diameter of the first opening portion and the minimum diameter of the second opening portion.

14. The printed wiring board according to claim 13, wherein the first opening portion of the penetrating hole is formed such that the first opening portion is tapering from the first surface toward the second surface of the insulating substrate, and the second opening portion of the penetrating hole is formed such that the second opening portion is tapering from the second surface toward the first surface of the insulating substrate.

15. The printed wiring board according to claim 13, wherein the third opening portion has the center with respect to a thickness direction of the insulating substrate such that the center of the third opening portion is positioned in substantially a central portion of the insulating substrate with respect to the thickness direction of the insulating substrate.

16. The printed wiring board according to claim 13, wherein the insulating substrate comprises a resin material and two sheets each comprising a reinforcement material.

17. The printed wiring board according to claim 13, wherein the insulating substrate comprises a resin material and three sheets each comprising a reinforcement material.

18. The printed wiring board according to claim 13, wherein the insulating substrate comprises a resin material and a plurality of sheets each comprising a reinforcement material, the insulating substrate is formed such that the sheets of the reinforcement material are extending substantially parallel to the first surface of the insulating substrate, and the third opening portion of the penetrating hole is formed between two of the sheets of the reinforcement material.

19. The printed wiring board according to claim 13, wherein the insulating substrate comprises a resin material and a plurality of sheets each comprising a reinforcement material, and the penetrating hole in the insulating substrate is formed such that a portion of each of the sheets of the reinforcement material is extending inside the penetrating hole in the insulating substrate.

20. The printed wiring board according to claim 13, wherein the insulating substrate comprises a resin material and a plurality of sheets each comprising a reinforcement material, and the penetrating hole in the insulating substrate is formed such that a portion of each of the sheets of the reinforcement material is extending inside the penetrating hole in the insulating substrate and into the through-hole conductor in the first opening portion and the second opening portion.

21. The printed wiring board according to claim 13, wherein the first opening portion and the second opening portion of the penetrating hole are positioned such that a normal line passing perpendicular to the first surface of the insulating substrate and the center of an opening of the first opening portion on the first surface of the insulating substrate is shifted from a normal line passing perpendicular to the first surface of the insulating substrate and the center of an opening of the second opening portion on the second surface of the insulating substrate.

22. The printed wiring board according to claim 13, wherein the through-hole conductor has at least one hollow portion formed in the through-hole conductor inside the third opening portion of the penetrating hole.

23. The printed wiring board according to claim 13, wherein the insulating substrate has a thickness in a range of 100 μm to 300 μm.

* * * * *